(12) United States Patent
Nishihara

(10) Patent No.: US 9,627,896 B2
(45) Date of Patent: Apr. 18, 2017

(54) BATTERY SYSTEM INCLUDING A VOLTAGE DETECTING CIRCUIT FOR DETECTING VOLTAGES OF PLURAL BATTERY CELLS THROUGH VOLTAGE DETECTING LINES HAVING DIFFERENT LENGTHS

(71) Applicant: SANYO Electric Co., Ltd., Osaka (JP)

(72) Inventor: Yoshitomo Nishihara, Hyogo (JP)

(73) Assignee: SANYO ELECTRIC CO., LTD., Osaka (JP)

(*) Notice: Subject to any disclaimer, the term of this patent is extended or adjusted under 35 U.S.C. 154(b) by 180 days.

(21) Appl. No.: 14/400,553

(22) PCT Filed: Aug. 2, 2013

(86) PCT No.: PCT/JP2013/004694
§ 371 (c)(1),
(2) Date: Nov. 12, 2014

(87) PCT Pub. No.: WO2014/024452
PCT Pub. Date: Feb. 13, 2014

(65) Prior Publication Data
US 2015/0137824 A1    May 21, 2015

(30) Foreign Application Priority Data
Aug. 9, 2012 (JP) ................. 2012-176722

(51) Int. Cl.
*H02J 7/00* (2006.01)
*H01M 10/48* (2006.01)
(Continued)

(52) U.S. Cl.
CPC .............. *H02J 7/0021* (2013.01); *B60L 3/12* (2013.01); *B60L 7/14* (2013.01); *B60L 11/123* (2013.01);
(Continued)

(58) Field of Classification Search
CPC ........ H02J 7/0021; H02J 7/0052; H02J 7/007; H02J 7/0016; G01R 31/3658; G01R 31/3624; H01M 10/482
(Continued)

(56) References Cited

U.S. PATENT DOCUMENTS 5,993,992 A * 11/1999 Field ................ H01M 2/202
429/156
8,299,801 B2 * 10/2012 Yano .................. H01M 2/1066
320/104

(Continued)

FOREIGN PATENT DOCUMENTS

EP          1460744        9/2004
JP          2000-014023    1/2000
(Continued)

OTHER PUBLICATIONS

International Search Report of PCT application No. PCT/JP2013/004694 dated Oct. 29, 2013.

*Primary Examiner* — Richard Isla Rodas
*Assistant Examiner* — Manuel Hernandez
(74) *Attorney, Agent, or Firm* — Wenderoth, Lind & Ponack, L.L.P.

(57) ABSTRACT

A battery system comprises plural battery cells, a voltage detecting circuit detecting voltage of each of the battery cells, and plural voltage detecting lines connecting an electrode terminal of each of the battery cells to input side of the voltage detecting circuit, and the voltage detecting circuit detects the voltage of each of the battery cells through the voltage detecting lines. The voltage detecting lines have different lengths, and at least one of the voltage detecting lines has a resistance adjusting portion which equalizes electrical resistances of the long voltage detecting line and the short voltage detecting line, and through the plural voltage detecting lines of which electrical resistances are (Continued)

equalized by the resistance adjusting portion, the voltage detecting circuit detects the voltage of each of the battery cells.

9 Claims, 9 Drawing Sheets

(51) Int. Cl.
| | |
|---|---|
| *B60L 11/18* | (2006.01) |
| *G01R 31/36* | (2006.01) |
| *B60L 3/12* | (2006.01) |
| *B60L 7/14* | (2006.01) |
| *B60L 11/12* | (2006.01) |

(52) U.S. Cl.
CPC ....... *B60L 11/1859* (2013.01); *B60L 11/1861* (2013.01); *B60L 11/1866* (2013.01); *B60L 11/1877* (2013.01); *B60L 11/1879* (2013.01); *G01R 31/3624* (2013.01); *G01R 31/3658* (2013.01); *H01M 10/482* (2013.01); *H02J 7/007* (2013.01); *H02J 7/0016* (2013.01); *H02J 7/0052* (2013.01); *B60L 2210/40* (2013.01); *B60L 2240/12* (2013.01); *B60L 2240/545* (2013.01); *B60L 2240/547* (2013.01); *B60L 2240/549* (2013.01); *G01R 31/3637* (2013.01); *Y02T 10/6217* (2013.01); *Y02T 10/7005* (2013.01); *Y02T 10/7044* (2013.01); *Y02T 10/7055* (2013.01); *Y02T 10/7061* (2013.01); *Y02T 10/7077* (2013.01); *Y02T 10/7241* (2013.01)

(58) Field of Classification Search
USPC ........................................................ 324/434
See application file for complete search history.

(56) References Cited

U.S. PATENT DOCUMENTS

| | | | | |
|---|---|---|---|---|
| 9,165,646 | B2* | 10/2015 | Lee | G11C 13/004 |
| 2006/0290355 | A1* | 12/2006 | Lee | G01R 31/3624 |
| | | | | 324/429 |
| 2008/0090139 | A1* | 4/2008 | Hurst | H01M 2/1016 |
| | | | | 429/156 |
| 2009/0134718 | A1* | 5/2009 | Hurst | H01M 2/206 |
| | | | | 307/150 |
| 2009/0167248 | A1 | 7/2009 | Murao et al. | |
| 2010/0271867 | A1* | 10/2010 | Lee | G11C 8/08 |
| | | | | 365/163 |
| 2011/0007550 | A1* | 1/2011 | Siegert | G11C 5/025 |
| | | | | 365/148 |
| 2012/0187759 | A1* | 7/2012 | Kamichi | B60L 3/003 |
| | | | | 307/10.1 |
| 2016/0211844 | A1* | 7/2016 | Houck | G06F 13/00 |

FOREIGN PATENT DOCUMENTS

| | | |
|---|---|---|
| JP | 2004-282960 | 10/2004 |
| JP | 2007-300701 | 11/2007 |
| JP | 2009-159794 | 7/2009 |
| WO | 2012/026093 | 3/2012 |

* cited by examiner

BATTERY SYSTEM INCLUDING A VOLTAGE DETECTING CIRCUIT FOR DETECTING VOLTAGES OF PLURAL BATTERY CELLS THROUGH VOLTAGE DETECTING LINES HAVING DIFFERENT LENGTHS

CROSS-REFERENCE TO RELATED APPLICATIONS

The present application is a national stage application of international application PCT/JP2013/004694 filed on Aug. 2, 2013, and claims the benefit of foreign priority of Japanese patent application 2012-176722 filed on Aug. 9, 2012, the contents both of which are incorporated herein by reference.

TECHNICAL FIELD

The present invention is related to a battery system having a voltage detecting circuit to detect voltages of plural battery cells, especially the battery system, and an electric vehicle and a storage battery device equipped with the battery system by voltage detecting lines connecting the battery cells and the voltage detecting circuit, detecting the voltages of the battery cells.

BACKGROUND ART

In the large output of a battery system, a high voltage is obtained by connecting a lot of battery cells in series. In this battery system, the series connected battery cells are charged by the same charging current, and discharged with the same discharging current. Therefore, when all of the battery cells have exactly the same battery property, unbalances in the battery voltages or the remaining capacity do not occur. However, the battery cells having exactly the same battery property, cannot be actually manufactured. When charging and discharging are repeated, the unbalance of the battery cells occurs in the unbalances in the battery voltages or the remaining capacity. Further, the unbalance in the battery voltages causes over charge or over discharge in a specific battery cell. In order to prevent over charge or over discharge of the battery cells, a battery system which detects the voltage of each of the battery cells and controls current of charge and discharge, has been developed. (refer to patent literature 1)

CITATION LIST

Patent Literature

Patent Literature 1: Japanese Laid-Open Patent Publication No. 2007-300701

SUMMARY OF THE INVENTION

This battery system detects the voltage of each of the battery cells by a voltage detecting circuit, and controls charge or discharge of a battery block in order to prevent over charge or over discharge of each of the battery cells. A circuit board includes the voltage detecting circuit, and input side of the voltage detecting circuit is connected to each of the battery cells through voltage detecting lines in order to detect the voltage of each of the battery cells. One end portions of the voltage detecting lines are connected to positive and negative electrode terminals of each of the battery cells, and the other end portions thereof are connected to the circuit board including the voltage detecting circuit. In the battery block in which the plural battery cells are connected in series, since each of the battery cells is connected to the circuit board which includes the voltage detecting circuit, for example, the battery block in which 10 to 20 pieces of the battery cells are connected in series, is connected to the circuit board through the 11 to 21 lines of the voltage detecting lines. One end portion of each of the voltage detecting lines is connected to the electrode terminal of each of the battery cells, and the other end portion thereof is connected to the circuit board located adjacent to the battery block. However, as all of the voltage detecting lines cannot be made the same length, electric resistances of the voltage detecting lines are different. Therefore, the electric resistance of a long voltage detecting line is higher than the electric resistance of a short voltage detecting line. Further, a load current of the battery block does not flow through the voltage detecting lines, and the number of the lines is large. Therefore, as a fine wire harness, a flexible printed circuit board, or the like is used, differences of the electrical resistances by the lengths of the lines are large. The differences of the electrical resistances in the voltage detecting lines cause measurement error in the voltage detecting circuit. It is a reason why the electric resistance of the voltage detecting line causes the voltage drop. Therefore, when the electric resistances of the voltage detecting lines are different, the voltage detecting circuit cannot correctly detect the voltage of the battery cell. The voltage detecting circuit which cannot correctly detect the voltage of the battery cell, cannot control over charge or over discharge in an ideal state, and makes the battery property of a specific battery cell decreased, and degraded.

The present disclosure is developed for the purpose of solving such drawbacks. One non-limiting and explanatory embodiment provides a battery system, and an electric vehicle and a storage battery device equipped with the battery system which more accurately detect the voltage of each of the battery cells, and effectively prevent degradation of the battery cells or decrease of the battery property.

A battery system of the present disclosure comprises plural battery cells, a voltage detecting circuit detecting voltage of each of the battery cells, and plural voltage detecting lines connecting an electrode terminal of each of the battery cells to input side of the voltage detecting circuit, and the voltage detecting circuit detects the voltage of each of the battery cells through the voltage detecting lines. The voltage detecting lines have different lengths, and at least one of the voltage detecting lines has a resistance adjusting portion which equalizes electrical resistances of the long voltage detecting line and the short voltage detecting line, and through the plural voltage detecting lines of which electrical resistances are equalized by the resistance adjusting portion, the voltage detecting circuit detects the voltage of each of the battery cells.

Accordingly, the above battery system accurately detects the voltage of each of the battery cells, and effectively prevents degradation of battery cells or decrease of the battery property. It is the reason why the above battery system has the resistance adjusting portion in the voltage detecting line, and eliminates the unbalance of electrical resistances of the long voltage detecting line and the short voltage detecting line, and equalizes the voltage drops of the voltage detecting lines. Namely, it is the reason why in both of the battery cell connected to the voltage detecting circuit through the long voltage detecting line and the battery cell connected to the voltage detecting circuit through the short voltage detecting line, the voltages are detected in the same condition each other, and measurement error of the unbalance by the voltage drops is negligible. In addition, in order to more accurately detect the voltages of the battery cells, in the battery system which compensates the voltage drops of the voltage detecting lines, as the compensating voltages by the voltage drop are the same voltage, the voltages of the battery cells can be more accurately detected by simple compensation.

In the battery system of the present disclosure, the plural voltage detecting lines are provided in an electrical printed circuit board, and the resistance adjusting portion in which the lateral width (W) of the long voltage detecting line is wider than the lateral width (W) of the short voltage detecting line, equalizes electrical resistances of the long voltage detecting line and the short voltage detecting line.

In the above battery system, as the electrical resistances of the long voltage detecting line and the short voltage detecting line are equalized by the lateral width (W) of the voltage detecting line included in the printed circuit board, the electrical resistances are simply, easily, and correctly equalized, and the voltages of the battery cells are accurately detected.

In the battery system of the present disclosure, a circuit board includes the voltage detecting circuit, and the circuit board has connecting terminals at a predetermined interval connected to the plural voltage detecting lines. Further, the plural voltage detecting lines are provided in a flexible printed circuit board, and the flexible printed circuit board has connecting portions connected to the connecting terminals of the circuit board, and the resistance adjusting portion of the voltage detecting lines is disposed in spaced relationship with the connecting portions, and the connecting portions have the same lateral width as each other, and are disposed at equal spaces.

In the above battery system, while the flexible printed board which realizes the plural voltage detecting lines is simply connected to the circuit board including the voltage detecting circuit, the electrical resistances of the voltage detecting lines can be equalized. It is the reason why as the resistance adjusting portion provided in the flexible printed board is disposed in spaced relationship with the connecting portions, the connecting portions have the same lateral width as each other, and can be disposed at equal spaces.

In the battery system of the present disclosure, the voltage detecting line is a lead wire, and in the resistance adjust portion comprises the lead wire of the long voltage detecting line is thicker than the lead wire of the short voltage detecting line.

In the above battery system, the voltage detecting line is a lead wire, and as the electrical resistance is adjusted by the length and thickness of this lead wire, the electrical resistances of the voltage detecting lines are easily equalized at low cost, and the voltages of the battery cells can be accurately detected.

In the battery system of the present disclosure, in the resistance adjust portion the short voltage detecting line is connected to a resistor.

In the above battery system, as the resistance adjust portion is realized by the resistor, the electrical resistances of the voltage detecting lines are more correctly equalized, and the voltages of the battery cells can be accurately detected.

In the battery system of the present disclosure, a equalizing circuit comprises discharging circuits connected to the battery cells through the voltage detecting lines, and a control circuit which equalizes each of the battery cells by controlling discharge states of the discharging circuits. The voltage detecting circuit comprises a detecting portion which detects the discharge states of the discharging circuits, a compensating portion which by discharge states of the battery cells through detecting the discharge states of the discharging circuits, detects voltage drops of the voltage detecting lines, and compensates the detected voltages of the battery cells by the detected voltage drops.

In the above battery system, while the voltage detecting line is also used as the discharging circuits connected to the battery cell, the voltages of the batter can be accurately detected. It is the reason why the voltage drops of the voltage detecting lines in the state that the discharging circuits discharge the battery cells for equalizing, are equalized and the voltage of the battery cells can be detected. In the state that the discharging circuit discharges the battery cell for equalizing, the voltage drop becomes large with the discharging current flowing through the voltage detecting line for equalizing. In the voltage detecting lines in which those electrical resistances are equalized, the voltage drops by the discharging currents equalizing the battery cells can be equal. Therefore, in the state that the discharging currents of equalizing the battery cells flow the voltage detecting lines, the voltage drops of the voltage detecting lines are specified as a constant voltage value, and the voltages of the battery cells can be accurately detected by compensating the specified voltage drop.

In the battery system of the present disclosure, the compensating portion has a memory which stores the voltage drop as compensating voltage in the discharge state, and compensates the detected voltages by the compensating voltage stored by the memory.

In the above battery system, as the voltage drop of the voltage detecting line by the discharging current equalizing the battery cells is stored in the memory as the compensating voltage, in the state of discharging the battery cell for equalizing, the detected voltages are compensated by the compensating voltage stored by the memory An electric vehicle equipped with the battery system of the present disclosure comprises any one of the above battery systems, an electric motor being energized by electric power that is supplied from the battery system, a vehicle body having the battery system and the electric motor; and a wheel being driven by the electric motor and driving the vehicle body.

In the above electric vehicle, as the voltage of each of the battery cells constituting the battery system included by this is accurately detected, and it effectively prevents degradation of battery cells or decrease of the battery property, and can be safely used in long time.

An storage battery device equipped with the battery system of the present disclosure comprises any one of the above battery systems, a power supply controller controlling charging and discharging of the battery system 100. The battery system is charged with an external power by the power supply controller, and charging of the battery system is controlled by the power supply controller.

In the above storage battery device, the voltage of each of the battery cells constituting the battery system included by this is accurately detected, it effectively prevents degradation of battery cells or decrease of the battery property, and can be safely used in long time.

DESCRIPTION OF EMBODIMENTS

Hereinafter, the embodiment of the present invention will be described referring to drawings. However, the following embodiments illustrate a battery system, and an electric vehicle and a storage battery device equipped with the battery system which are aimed at embodying the technological concept of the present invention, and the present invention is not limited to the battery system, and the electric vehicle and the storage battery device equipped with the battery system described below. However, the members illustrated in Claims are not limited to the members in the embodiments.

Figure 1:
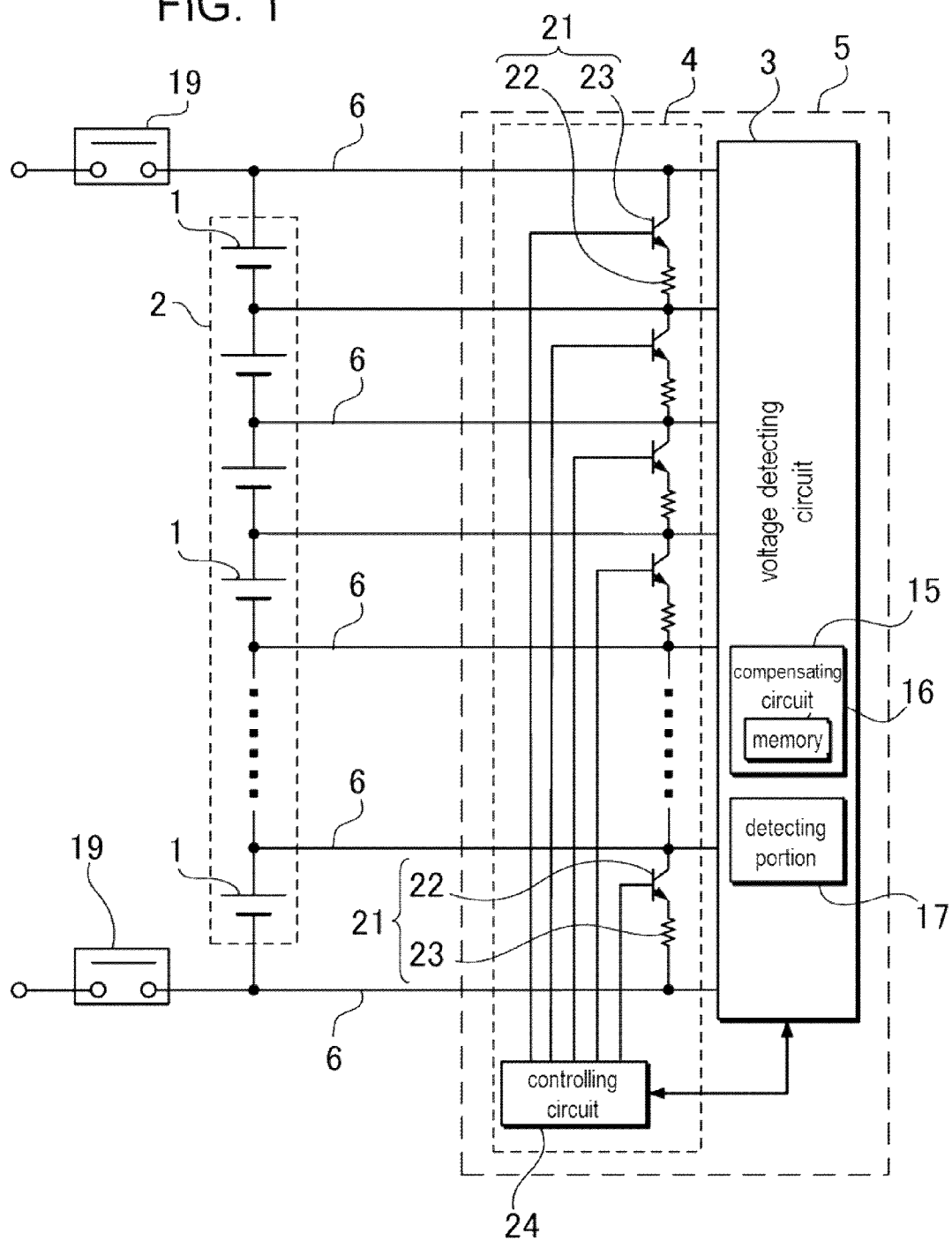
FIG. 1 is a block diagram of a battery system according to an embodiment of the present disclosure.

As shown in a block diagram of FIG. 1, the battery system comprises a battery block 2 in which plural rechargeable battery cells 1 are connected in series, and a voltage detecting circuit 3 which is connected to each of the battery cells 1 constituting the battery block 2 through voltage detecting lines 6 and detects voltage of each of the battery cells. Further, the battery system of FIG. 1 includes an equalizing circuit 4 which equalizes each of the battery cells 1 by discharging the battery cells 1 constituting the battery block 2. But, the battery system does not necessarily need to include the equalizing circuit of the battery cells.

Each of the battery cells 1 constituting the battery block 2 is one secondary battery. But, the battery cell can be also plural secondary batteries which are connected in series or parallel. The battery cell 1 is a non-aqueous electrolyte secondary cell, for example, such as, a lithium ion secondary battery, a lithium polymer battery, or the like. In the battery block 2 of the non-aqueous electrolyte secondary cell, such as, the lithium ion secondary battery, the lithium polymer battery, or the like as the battery cell, the battery cell 1 comprises one secondary battery. In this battery system, the voltage of each of the battery cells is detected by the voltage detecting circuit 3. However, all rechargeable batteries of a nickel-hydrogen battery or the like can be applied to the battery cell. In the battery system having the nickel-hydrogen battery as the secondary battery, a battery module in which plural secondary batteries are connected in series, is used as the one battery cell. Namely the voltage of each of the battery modules in which plural secondary batteries are connected in series, is detected, and the battery modules are equalized.

Figure 2:
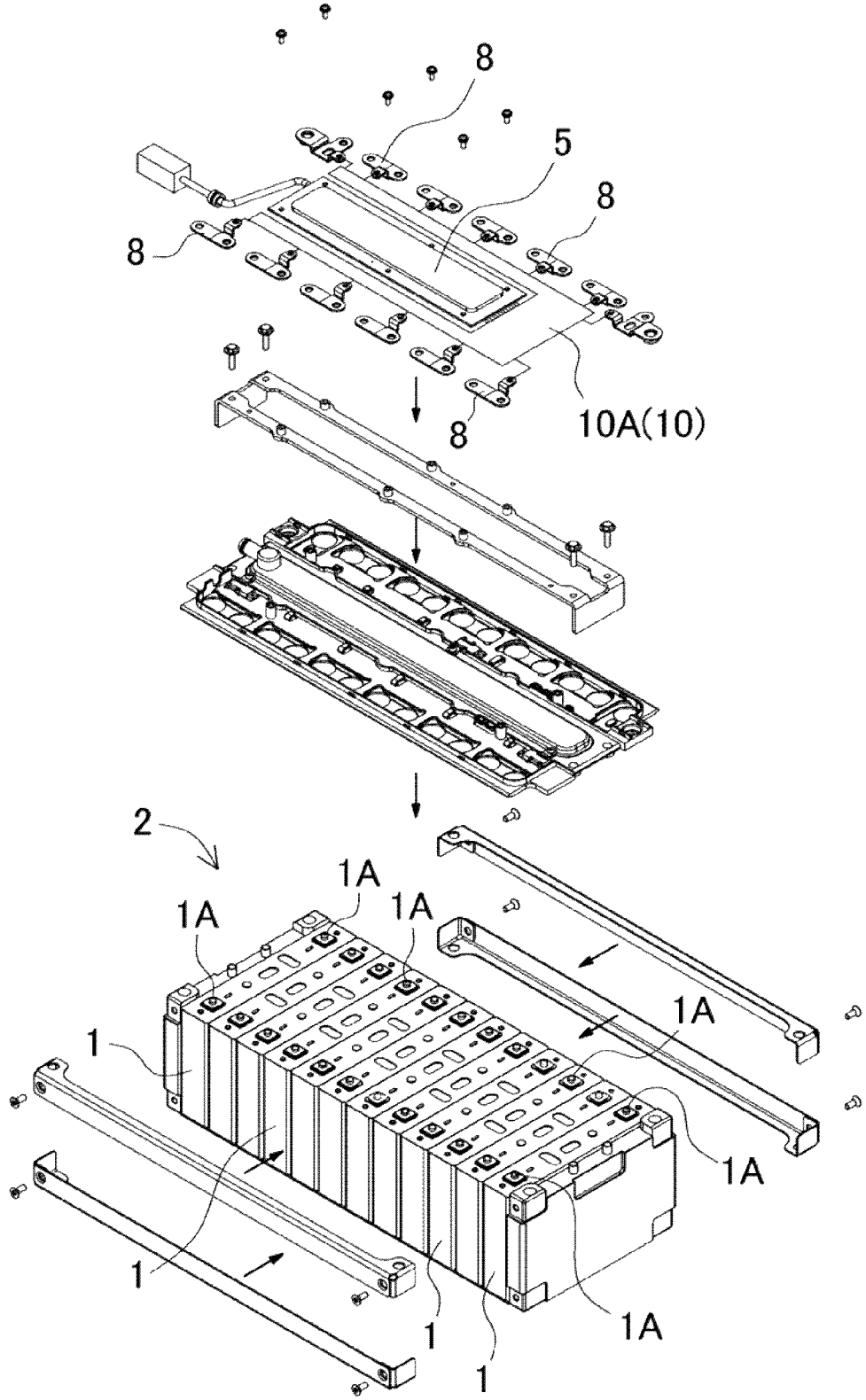
FIG. 2 is an explored perspective view of a battery system according to the embodiment of the present disclosure.

Input side of the voltage detecting circuit 3 is connected to positive and negative electrode terminals of each of the battery cells 1 through the voltage detecting line 6. The voltage detecting circuit 3 detects the voltage of each of the battery cells 1 through the voltage detecting line 6. The battery system of FIG. 2 comprises the battery block 2 having the plural battery cells 1, and an electrical circuit board 5 including the voltage detecting circuit 3. The plural battery cells 1 constituting the battery block 2 are connected in series by bus bars 8 coupling the electrode terminals 1A which are located adjacent to each other and facing each other. In the battery system shown in the figures, one end portions of the voltage detecting lines 6 are coupled to the bus bars 8, and voltages in connecting portions between the battery cells 1 which are connected in series through the bus bars 8 are detected by the voltage detecting lines 6. However, the plural battery cells 1 constituting the battery block can be connected in parallel, or in series and parallel.

Figure 3:
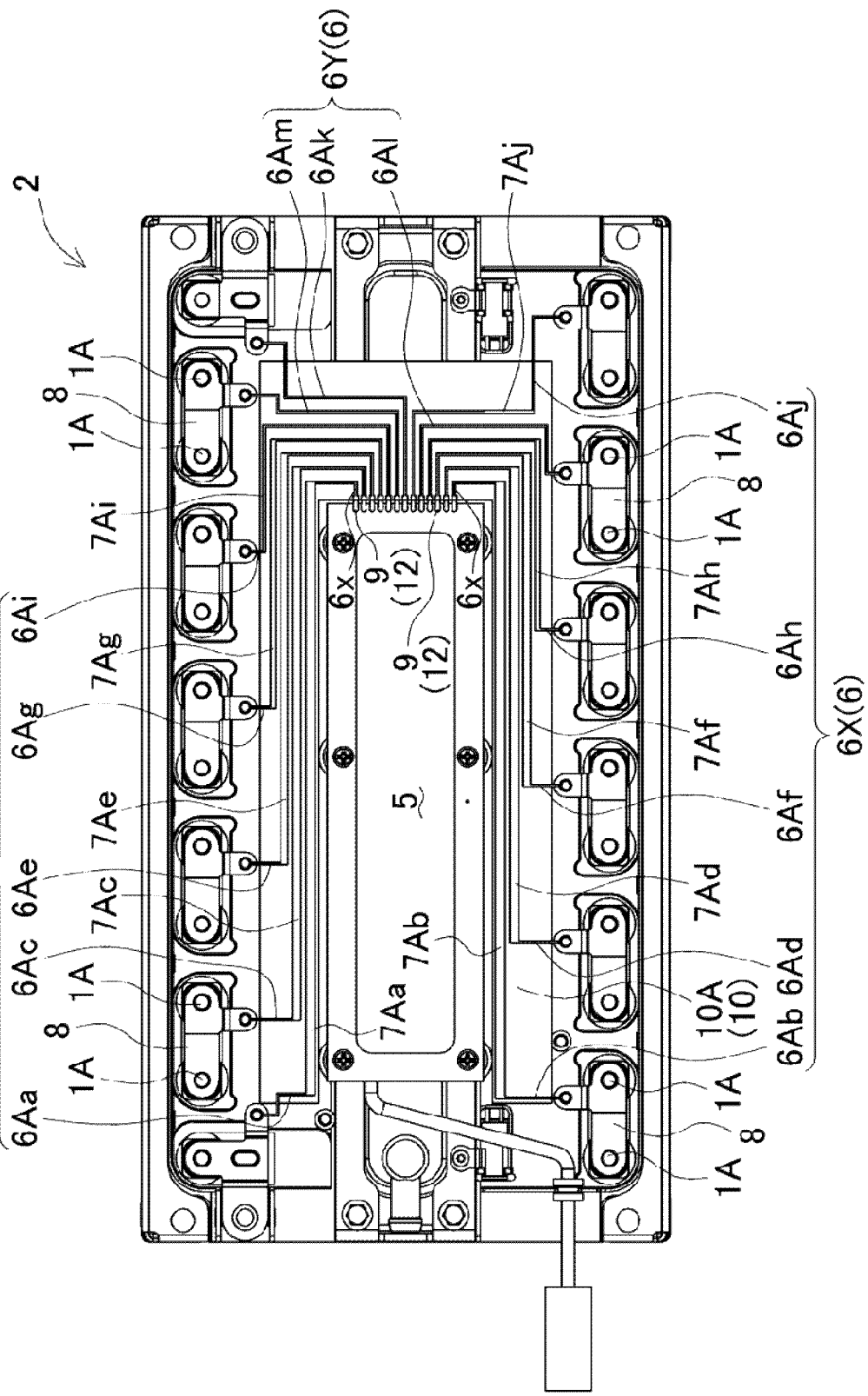
FIG. 3 is a plan view of the battery system shown in FIG. 2.
Figure 4:
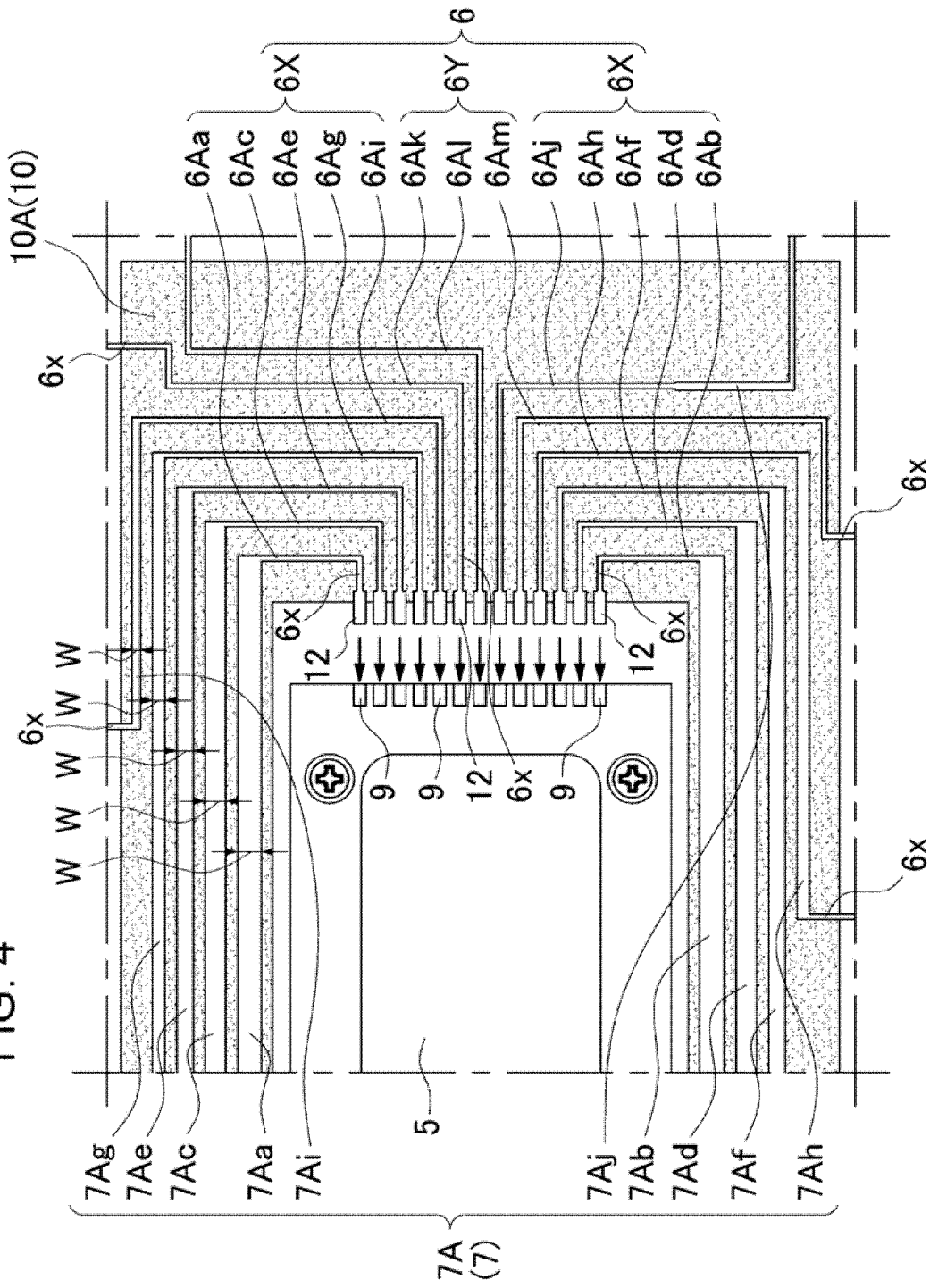
FIG. 4 is an enlarged view showing connecting structure of a circuit board and voltage detecting lines of the battery system shown in FIG. 3.

As shown in FIG. 3 and FIG. 4, the circuit board 5 has connecting terminals 9 at a predetermined interval, for example, at a constant interval in the figures. The connecting terminals 9 of the circuit board 6 are connected to the voltage detecting lines 6 which are connected to the electrode terminal 1A of each of the battery cells 1. The voltage detecting lines 6 are connected to the connecting terminals 9 of the circuit board 5 by soldering or the like.

As the voltage detecting lines 6 are connected to the connecting terminals 9 and the electrode terminal 1A of each of the battery cells 1, the voltage detecting lines 6 have different lengths. The voltage detecting lines 6 connected to the battery cells 1 which are located at positions distant from the connecting terminals 9 of the circuit board 5, are long. The voltage detecting lines 6 connected to the battery cells 1 which are located at positions near the connecting terminals 9, is short. Namely, the long voltage detecting lines 6X are connected to the battery cells 1 which are located at positions distant from the connecting terminals 9 of the circuit board 5, and the short voltage detecting lines 6Y are connected to the battery cells 1 which are located at positions near the connecting terminals 9. The voltage detecting lines 6 of different lengths have different resistances. When the electrical resistances of the voltage detecting lines 6 are different, variation of voltage drops made by flowing currents, causes measurement error of detecting the voltages of the battery cells 1. It is a reason why the voltage of the detected battery cell 1 is decreased by the voltage drop of the voltage detecting line 6. In order to prevent this demerit, namely to equalize the electrical resistances of the plural voltage detecting lines 6, at least one of the voltage detecting lines 6 has a resistance adjusting portion 7 which equalizes electrical resistances of the long voltage detecting line 6X and the short voltage detecting line 6Y. The resistance adjusting portion 7 provided in the long voltage detecting line 6X, makes the electrical resistance low, and the resistance adjusting portion 7 provided in the short voltage detecting line 6Y, makes the electrical resistance large.

FIG. 3 and FIG. 4 show a printed circuit board 10 including the voltage detecting lines 6. In the printed circuit board 10, the voltage detecting lines 6 are realized by plural conductive lines insulated from each other. When the long voltage detecting line 6X and the short voltage detecting line 6Y are realized by the same lateral width (W), the long voltage detecting line 6X has large electrical resistance. In order to equalize electrical resistances of the long voltage detecting line 6X and the short voltage detecting line 6Y, in the resistance adjusting portion 7 of this embodiment, the lateral width (W) of the conductive line realizing the long voltage detecting line 6X, is wider than the lateral width (W) of the conductive line realizing the short voltage detecting line 6Y. Namely, by providing large sectional area of the resistance adjusting portion 7A, its electrical resistance is made low, and then it equalizes electrical resistances of the voltage detecting lines 6.

In the plural voltage detecting lines 6 shown in FIG. 3 and FIG. 4, the voltage detecting lines 6Aa, 6Ab connected to the battery cell 1 which is located most distantly from the connecting terminals 9 of the circuit board 5, are longest. Next, the voltage detecting line 6Ac, the voltage detecting line 6Ad . . . the voltage detecting line 6Am are gradually getting shorter in this order. Here, as the voltage detecting lines 6Ak, 6Al, 6Am as the short voltage detecting lines 6Y have an approximately equal length, differences between those electrical resistances are small to a permissible extent, and then those have an equable lateral width of the conductive line, without the resistance adjusting portion 7A. On the other hand, in the voltage detecting lines 6Aa-6Am as the long voltage detecting lines 6X, the resistance adjusting portions 7A at the intermediate portions except end portions 6x are provided, and then the electrical resistances of the voltage detecting lines 6 are equalized. Especially, as shown in FIG. 4, the longest voltage detecting lines 6Aa, 6Ab have the widest lateral width (W) of the resistance adjusting portions 7Aa, 7Ab. As the voltage detecting line 6Ac, the voltage detecting line 6Ad, the voltage detecting line 6Ae . . . the voltage detecting line 6Aj are gradually getting shorter in this order, the lateral widths (W) of the resistance adjusting portions 7Ac-7Aj provided at those voltage detecting lines 6Ac-6Aj, are gradually getting narrower in the following order of the resistance adjusting portion 7Ac, the resistance adjusting portion 7Ad, the resistance adjusting portion 7Ae . . . the resistance adjusting portion 7Aj. From this, the electrical resistances in all of the voltage detecting lines 6Aa-6Am are equalized.

Here, the resistance adjusting portions provided in the long voltage detecting lines do not necessarily need to vary the lateral widths (W) corresponding to the lengths of the voltage detecting lines, and the electrical resistances in all of the voltage detecting lines are equalized by having an equable lateral width of the resistance adjusting portions and adjusting the lengths of the resistance adjusting portions. Namely, the resistance adjusting portions provided in the long voltage detecting lines, as the voltage detecting line becomes long, make the lengths of the wide lateral width portions of the resistance adjusting portions long, the ratio of the resistance adjusting portion to the narrow width portion of the conductive line is increased, and then the electrical resistances in all of the voltage detecting lines are equalized The printed circuit board 10 of FIG. 3 and FIG. 4 is a flexible printed circuit board 10A. The flexible printed circuit board 10A has connecting portions 12 connected to the connecting terminals 9 of the circuit board 5, and the connecting portions 12 are disposed at equal spaces. The connecting portions 12 has the same lateral width as each other at one end portions thereof, and are disposed at the same spaces as the connecting terminals 9 of the circuit board 5. In the flexible printed circuit board 10A, the connecting portions 12 disposed at the equal spaces, are connected to the connecting terminals 9 of the circuit board 5 by soldering or the like. Further, in the flexible printed circuit board 10A, the resistance adjusting portion 7A of the voltage detecting lines 6 are disposed in spaced relationship with the connecting portions 12. As the resistance adjusting portions 7A are disposed in spaced relationship with the connecting portions 12 in this flexible printed circuit board 10A, intervals of the plural conductive lines provided at the connecting portion 12 can be designed so as to be connected to the connecting terminal 9 without influencing the resistance adjusting portions 7A. The conductive lines having the wide lateral widths (W) of the resistance adjusting portions 7A dispose the resistance adjusting portions 7A at the intermediate portion thereof, and the lateral widths of both end portions 6x connected to the electrode terminals 1A of the battery cells 1 and the connecting terminals 9 of the circuit board 5, are the same lateral width as those of other conductive lines. In the flexible printed circuit board 10A, both end portions 6x of the narrow lateral widths can be easily and surely connected to the electrode terminals 1A of the battery cells 1 and the connecting terminals 9.

The conductive lines which realize the voltage detecting lines 6 provided in the flexible printed circuit board 10A, are connected to the electrode terminals 1A of the battery cells 1 at one end portions thereof, and the connecting terminals 9 of the circuit board 5 at other end portions thereof, and the electrode terminals 1A of the battery cells 1 are connected to the voltage detecting circuit 3 included in the circuit board 5.

Figure 5:
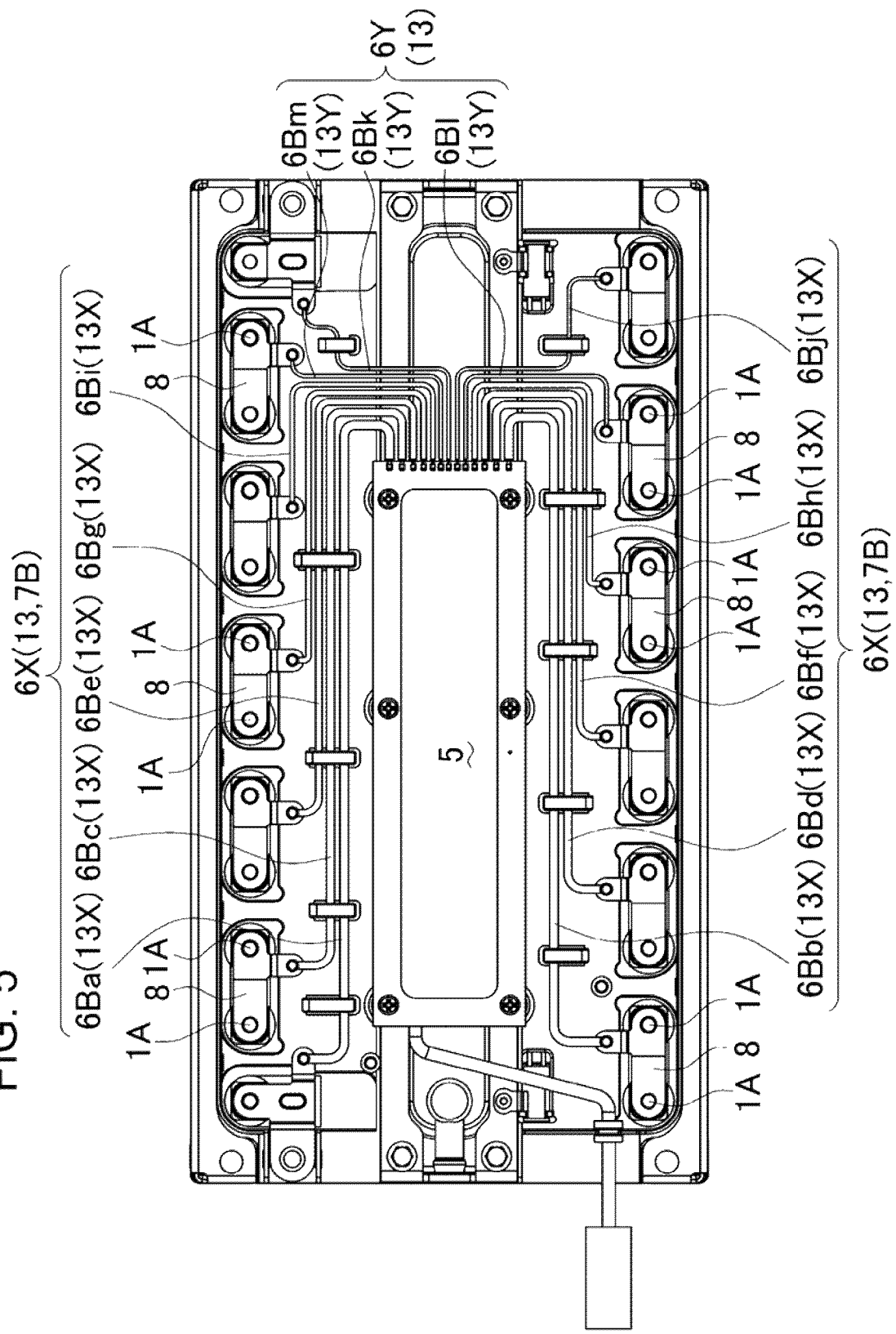
FIG. 5 is a plan view showing another example of the voltage detecting lines.

In the battery system of FIG. 5, the voltage detecting lines 6Ba-6Bm are lead wires 13. The voltage detecting lines 6Ba-6Bj of lead wires 13X as the long voltage detecting lines 6X are thicker than the voltage detecting lines 6Bk-6Bm of lead wires 13Y as the short voltage detecting lines 6Y, and the resistance adjusting portions 7B comprising the thick lead wires 13X to make electrical resistances low in the long voltage detecting lines 6X, are provided. As the electrical resistance of the lead wire is in direct proportion to its length and in inverse proportion to the sectional area of the conductive wire, in the voltage detecting lines 6Ba-6Bm the ratios of [length]/[sectional area] are made a constant, and then the electrical resistances are equalized.

Figure 6:
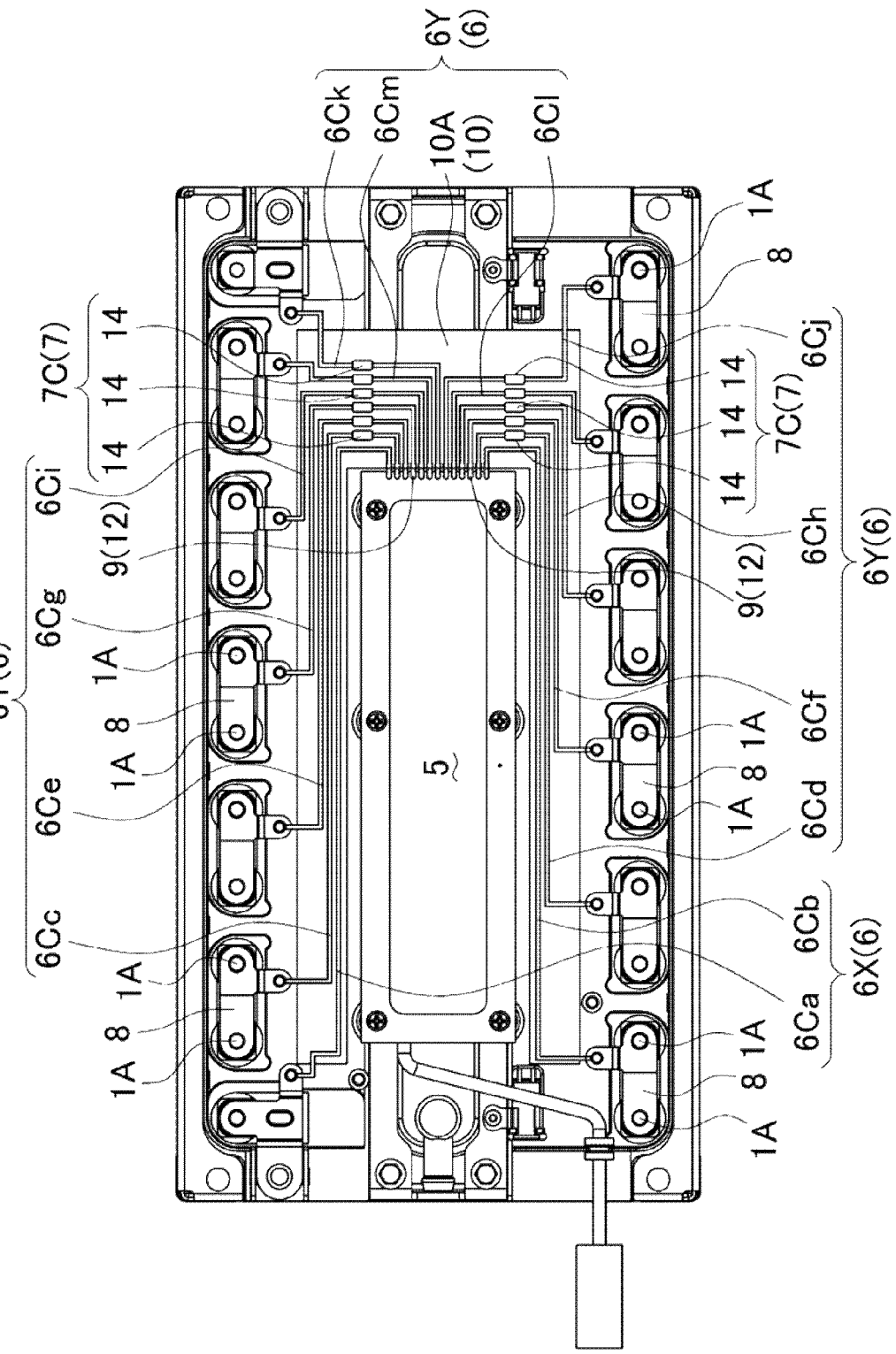
FIG. 6 is a plan view showing another example of the voltage detecting lines.

Further, in the battery system of FIG. 6, resistors 14 realizing the resistance adjusting portions 7C are connected in the short voltage detecting lines 6Y, and the electrical resistances of the short voltage detecting lines 6Y are made large by the resistors 14, and then the electrical resistances of the plural voltage detecting lines 6 are equalized. As the electrical resistances of the voltage detecting lines 6 become large in direct proportion to those lengths, the resistors 14 are connected in the short voltage detecting line 6Y. In the plural voltage detecting lines 6 shown in FIG. 6, the voltage detecting lines 6Ca, 6Cb connected to the battery cell 1 which is located most distantly from the connecting terminals 9 of the circuit board 5, are longest. Next, the voltage detecting line 6Cc, the voltage detecting line 6Cd . . . the voltage detecting line 6Cm are gradually getting shorter in this order. Here, as the voltage detecting lines 6Ca, 6Cb as the long voltage detecting lines 6X have an approximately equal length, differences between those electrical resistances are small to a permissible extent, and then those have an equable lateral width of the conductive line, without connecting the resistors 14. On the other hand, in the voltage detecting lines 6Cc-6Cm as the short voltage detecting lines 6Y, the resistors 14 at the intermediate portions are provided, and then the electrical resistances of the voltage detecting lines 6 are equalized. The electrical resistances of the resistors 14 connected to the short voltage detecting lines 6Y are set such that the electrical resistances of the voltage detecting lines 6Cc-6Cm are the same as the electrical resistances of the longest voltage detecting lines 6Ca, 6Cb.

The voltage detecting circuit 3 can more accurately detect the voltages of the battery cells 1 by compensating the detected voltages considering voltage drops of the voltage detecting lines 6. This voltage detecting circuit 3 as shown in FIG. 1 comprises a compensating circuit 15 which compensates the voltage by subtracting the voltage drops of the voltage detecting lines 6 from the detected voltages. The voltage detecting circuit 3 having the compensating circuit 15 can accurately detect the voltages of the battery cells 1 by compensating the detected voltages considering voltage drops of the voltage detecting lines 6. Further, by turning on and off discharge switches 22 of an equalizing circuit 4 mentioned below, the detected voltages are also compensated. Therefore, the voltages of the battery cells can be accurately detected while the battery cells are equalized.

The equalizing circuit 4 equalizes the cell voltages of the battery cells 1, and eliminates the unbalance. The equalizing circuit 4 detects the voltages of each of the battery cells 1, and eliminates the unbalance of the voltages of each of the battery cells 1, and equalizes those. After the equalizing circuit 4 equalizes all of the battery cells 1, the equalizing circuit 4 stops operations.

The equalizing circuit 4 eliminates the unbalance by discharging the battery cells 1 having high voltages. The equalizing circuit 4 comprises a discharge circuit 21 which is connected in parallel to each of the battery cells 1, and a controlling circuit 24 which carries out ON-OFF control of a discharge switch 22 in this discharge circuit 21. The discharge circuit 21 comprises a series circuit of a discharge resistor 23 and the discharge switch 22. As the discharge circuit 21 equalizes by independently discharging each of the battery cells 1, the same number of the discharge circuits 21 as pieces of the battery cells 1 are provided. For example, when 100 pieces of the battery cells 1 are connected in series in the battery system, 100 sets of the discharge circuits 21 are provided. The discharge switch 21 and the discharge resistor 23 which constitute each of the discharge circuits 21, are included in the circuit board 5. The discharge circuit 21 is connected to each of the battery cells 1 through the voltage detecting lines 6 of the voltage detecting circuit 3. Therefore, the voltage detecting lines 6 are connected to each of the battery cells 1 at input sides thereof, and also to each of the discharge circuits 21.

The equalizing circuit 4 comprises the controlling circuit 24 which carries out ON-OFF control of the discharge switches 22 by the voltages of the battery cells 1. The controlling circuit 24 of FIG. 1 carries out ON-OFF control of each of the discharge switches 22 based on the detected voltage of the battery cell 1 by the voltage detecting circuit 3. The circuit detecting the voltage of the battery cells 1 in the voltage detecting circuit 3 is also used as the equalizing circuit 4. However, the equalizing circuit can also have an exclusive useable voltage detecting circuit to detect the voltages of the battery cells.

The controlling circuit 24 compares the voltages of the battery cells 1 detected by the voltage detecting circuit 3, and carries out ON-OFF control of the discharge switches 22 so as to equalize all of the voltages of the battery cells 1. This controlling circuit 24 turns on the discharging switch 22 of the discharge circuit 21 connected to the battery cell 1 having too high voltage, and discharge its battery cell 1. As the discharging progresses, the voltage of the battery cell 1 decreases. When the voltage of the battery cell 1 decreases until the voltage of the battery cell 1 and the voltages of the other battery cells 1 are balanced, the discharge switch 22 is switched from ON to OFF. At the time of turning off the discharge switch 22, the discharge of the battery cell 1 is stopped. Thus, the controlling circuit 24 balances the voltages of all of the battery cells 1.

In the battery system of FIG. 1, the discharge circuits 21 of the equalizing circuit 4 are connected to each of the battery cells 1 through the voltage detecting lines 6 connecting the voltage detecting circuit 3 to each of the battery cells 1. Therefore, when the voltage detecting circuit 3 detects the voltage of each of the battery cells 1, the discharge switches 22 connected to some battery cells 1 are ON, or the discharge switches 22 connected to the other battery cells 1 are OFF. When the discharge switch 22 is in the ON state, the voltage drop in the voltage detecting lines 6 by discharge current which flows through the discharge resistor 23, occurs. When the discharge switch 22 is in the OFF state, since the discharge current does not flow, the voltage drop in the voltage detecting lines 6 does not occur. Accordingly, when the voltage detecting circuit 3 detects the voltage of each of the battery cells 1, depending on ON or OFF of the discharge switch 22, the voltage drop of the voltage detecting lines 6 varies, and then the variation of the voltage drop causes measurement error in the detected voltage of the battery cells 1.

In order that this demerit is solved, and the voltage detecting circuit 3 always and accurately detects the voltages of the battery cells 1, the battery system of FIG. 1 comprises a compensating circuit 15 in the voltage detecting circuit 3. The compensating circuit 15 has a memory 16 which stores the voltage drop in the voltage detecting line 6 in the ON state of the discharge switch 22 as compensating voltage. The compensating circuit 15 detects the voltage drop in the voltage detecting line 6 in a state that the discharge circuit 21 is connected to the battery cell 1 by turning on the discharge switch 22, and stores this voltage drop as compensating voltage in the memory 16. The compensating circuit 15 can detect the voltage drop of the voltage detecting line 6 by subtracting the ON voltage in the ON state of the discharge switch 22 from the OFF voltage in the OFF state of the discharge switch 22. As there is no voltage drop of the voltage detecting line 6 in the OFF state of the discharge switch 22 and there is a voltage drop of the voltage detecting line 6 in the ON state of the discharge switch 22, the voltage drop can be detected from its difference voltage. As the electrical resistances of the voltage detecting lines 6 are equalized by the resistance adjusting portions 7, in the compensating circuit 15, the compensating voltage is detected from any one of the voltage detecting lines 6, and the voltage drops in all of the voltage detecting lines 6 are compensated by using this compensating voltage.

When the battery cell 1 is discharged through the voltage detecting line 6 with the charging switch 22 turned off, the voltage drop as the product of this discharge current and the electrical resistance R occurs. The voltage drop decreases the voltage which the voltage detecting circuit 3 detects as the voltage of the battery cell 1. Therefore, when the voltage detecting circuit 3 detects the voltage of the battery cell 1 which is connected in parallel to the discharge switch 22 of the ON state, the voltage detecting circuit 3 can accurately detect the voltage of each of the battery cells 1, using the voltage obtained by adding the compensating voltage to the detected voltage as the voltage of the battery cell 1. Further, when the voltage detecting circuit 3 detects the voltage of the battery cell 1 which is connected in parallel to the discharge switch 22 of the OFF state, the voltage detecting circuit 3 can accurately detect the voltage of each of the battery cells 1, using the detected voltage as the voltage of the battery cell 1. The voltage detecting circuit 3 comprises a detecting portion 17 which detects the ON or OFF of the discharge switch 22. As the controlling circuit 24 of the equalizing circuit 4 carries out ON-OFF control of the discharge switch 22, the detecting portion 17 detects the ON or OFF of the discharge switch 22 based on the ON or OFF signals of the discharge switch 22 inputted from the controlling circuit 24, and determines as to if the compensating voltage is added to the detected voltage.

Further, as the voltage detecting circuit 3 comprises the compensating circuit 15 which detects the voltage drop of each the voltage detecting lines 6 in the state of discharging each of the battery cells 1 by the discharge circuit 21, the voltage detecting circuit 3 can determine failure of the voltage detecting line 6 by detecting the voltage drop of each of the voltage detecting line 6. This compensating circuit 15 determines failure of the voltage detecting lines 6 by comparing the detected voltage drop of each of the voltage detecting lines 6 with a predetermined voltage stored in advance. The predetermined voltage stored in the compensating circuit 15 is the maximum voltage drop of the voltage detecting line 6 without failure.

As the electrical resistances of the voltage detecting lines 6 are equalized and equal each other, in a stare of the voltage detecting lines 6 without failure, the voltage drops are equal each other. Therefore, when the voltage drop of the voltage detecting line 6 is higher than the predetermined voltage, the failure can be determined. The electrical resistance of the voltage detecting line 6 is increased by the reasons of contact failure between the connecting terminal 9 and the connecting portion 12, damages of the lead wire 13, or the like. When the voltage drop of the voltage detecting line 6 detected by the compensating circuit 15 is higher than the predetermined voltage, the voltage detecting circuit 3 determines the failure of the voltage detecting line 6. Thus, the failure of the voltage detecting line 6 which occurs with the elapse of time, can be immediately detected, and improve the safety of the apparatus.

Further, the voltage detecting circuit 3 can more accurately detect the voltage of the battery cell 1 by compensating the voltage drop of the voltage detecting line 6 by current which flows at input side of the voltage detecting circuit 3, namely input current of the voltage detecting circuit 3. The voltage drop of the voltage detecting line 6 in this state, can be calculated from the product of the input current and the electrical resistance of the voltage detecting line 6 by detecting the input current of the voltage detecting circuit 3 and measuring the electrical resistance of the voltage detecting line 6, Since this voltage drop occurs as the same voltage in all of the voltage detecting line 6, the voltage of the battery cell 1 is accurately obtained by subtracting this voltage drop from the detected voltage.

Figure 7:
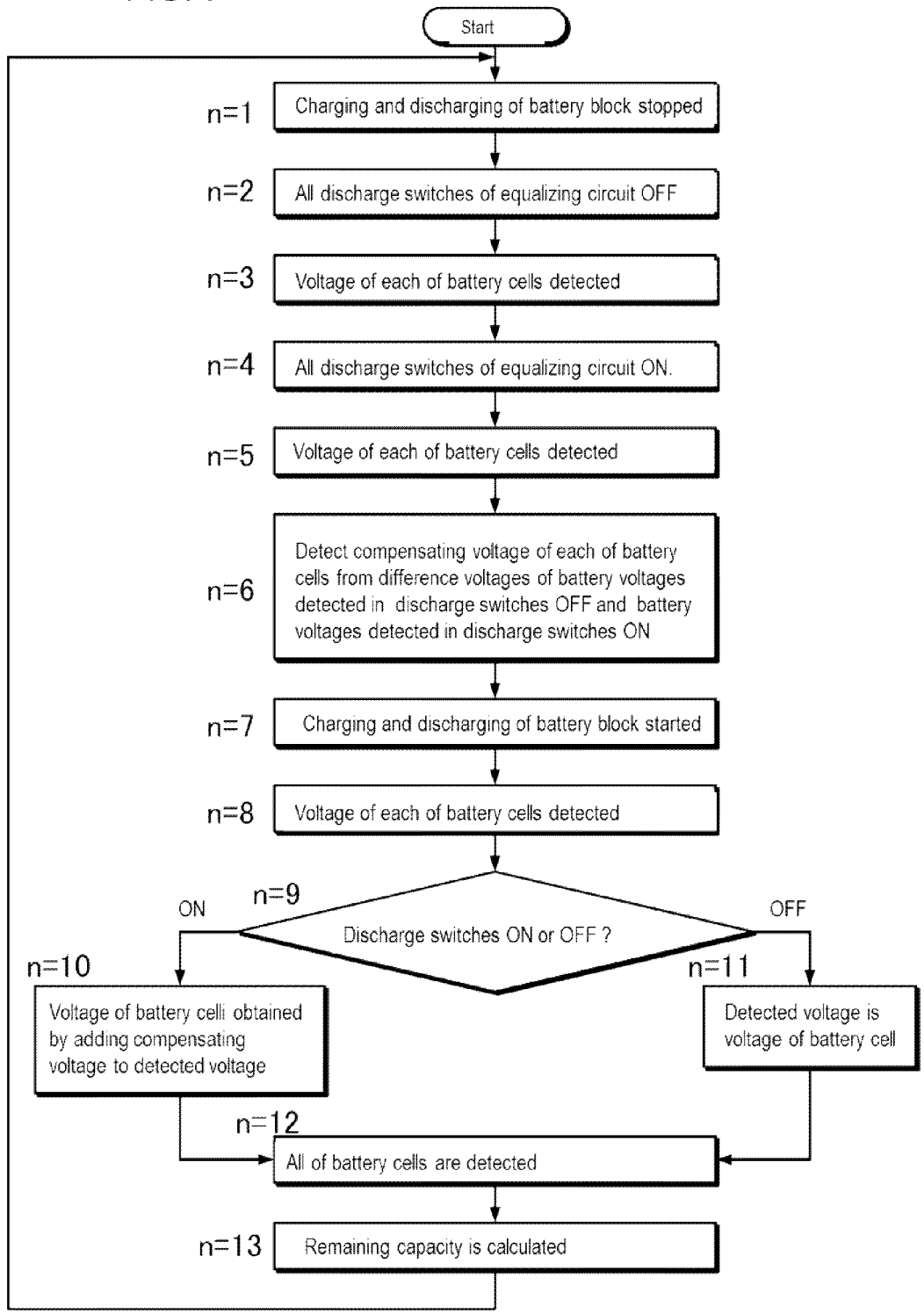
FIG. 7 is a flow chart of detecting the voltage of each of battery cells in the battery system shown in FIG. 1.

As shown in a flow chart of FIG. 7, the above battery system accurately detects the voltage of each of the battery cells 1 while equalizing the battery cells 1 of the battery block 2 in the following operation.

(Step n=1)

The charging and discharging of the battery block 2 are stopped, by turning off contactors 19.

(Step n=2)

All of the discharge switches 22 of the equalizing circuit 4 are turned off.

(Step n=3)

The voltage of each of the battery cells 1 are detected by the voltage detecting circuit 3.

(Step n=4)

All of the discharge switches 22 of the equalizing circuit 4 are turned on.

(Step n=5)

The voltage of each of the battery cells 1 are detected by the voltage detecting circuit 3.

(Step n=6)

The compensating circuit 15, detects the voltage drop of the voltage detecting line 6 which detects the voltage of each of the battery cells 1, namely the compensating voltage of each of the battery cells 1 from the difference voltages of the battery voltages detected in the OFF state of the discharge switches 22 at step 3 and the battery voltages detected in the ON state of the discharge switches 22 at step 5, and stores those in the memory 16.

(Step n=7)

The charging and discharging of the battery block 2 are started, by turning on the contactors 19.

(Step n=8-12)

The voltage detecting circuit 3 detects the voltage of each of the battery cells 1. At this time, the voltage detecting circuit 3 by the detecting portion 17 detects the ON or OFF of the discharge switches 22 connected in parallel with the battery cells 1 of which the voltages are detected. When the discharge switch 22 is in the ON state, the voltage of the battery cell 1 is obtained by adding the compensating voltage to the detected voltage (step 10), or when the discharge switch 22 is in the OFF state, the voltage of the battery cell 1 is obtained as the detected voltage (step 11).

As mentioned above, the voltage in all of the battery cells 1 are detected.

(Step n=13)

The remaining capacity in each of the battery cells 1 is calculated from the detected battery voltage. After that, the operation returns to step 1.

The aforementioned battery systems can be used as a power supply for vehicles. The battery system can be installed on electric vehicles such as hybrid cars that are driven by both an internal-combustion engine and an electric motor, and electric vehicles that are driven only by an electric motor. The battery system can be used as a battery system for these types of vehicles.

(Hybrid Car Battery System)

Figure 8:
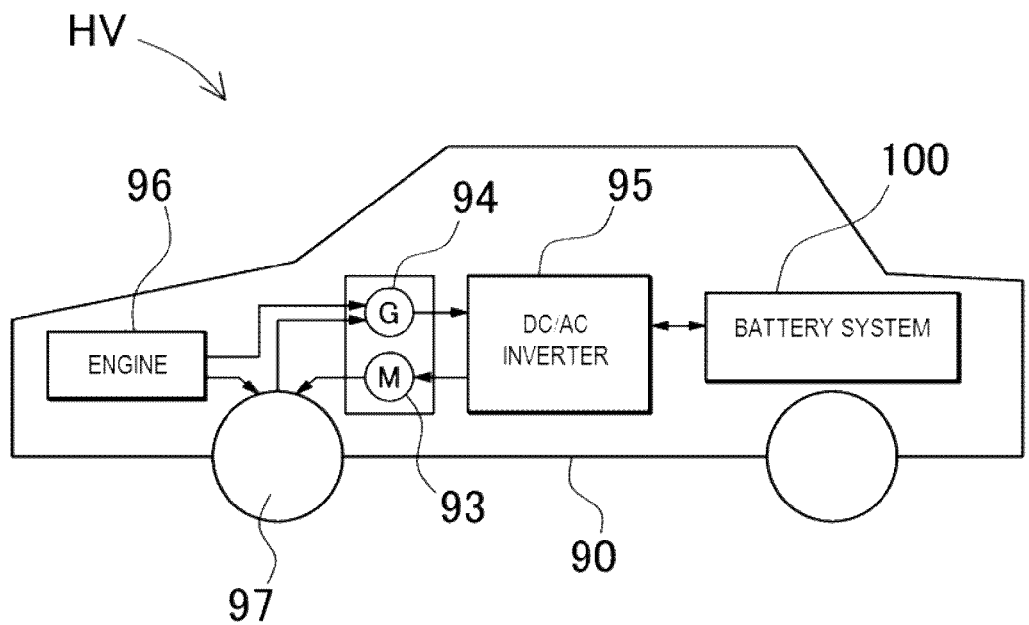
FIG. 8 is a block diagram showing one explanatory embodiment of a hybrid car driven by an engine and a motor in which the battery system is installed.

FIG. 8 is a block diagram showing an exemplary hybrid car that is driven both by an engine and an electric motor, and includes the battery system. The illustrated vehicle HV with the battery system includes an electric motor 93 and an internal-combustion engine 96 that drive the vehicle HV, a battery system 100 that supplies electric power to the electric motor 93, and an electric generator 94 that charges batteries of the battery system 100, a vehicle body 90 that incorporates the engine 96, the motor 93, and the generator 94, and a wheel or wheels 97 that can be driven by the engine 96 or the electric motor 93, and drive the vehicle body 90. The battery system 100 is connected to the electric motor 93 and the electric generator 94 via a DC/AC inverter 95. The vehicle HV is driven both by the electric motor 93 and the internal-combustion engine 96 with the batteries of the battery system 100 being charged/discharged. The electric motor 93 is energized with electric power and drives the vehicle in a poor engine efficiency range, e.g., in acceleration or in a low speed range. The electric motor 93 is energized by electric power that is supplied from the battery system 100. The electric generator 94 is driven by the engine 96 or by regenerative braking when users brake the vehicle so that the batteries of the battery system 100 are charged.

(Electric Vehicle Battery System)

Figure 9:
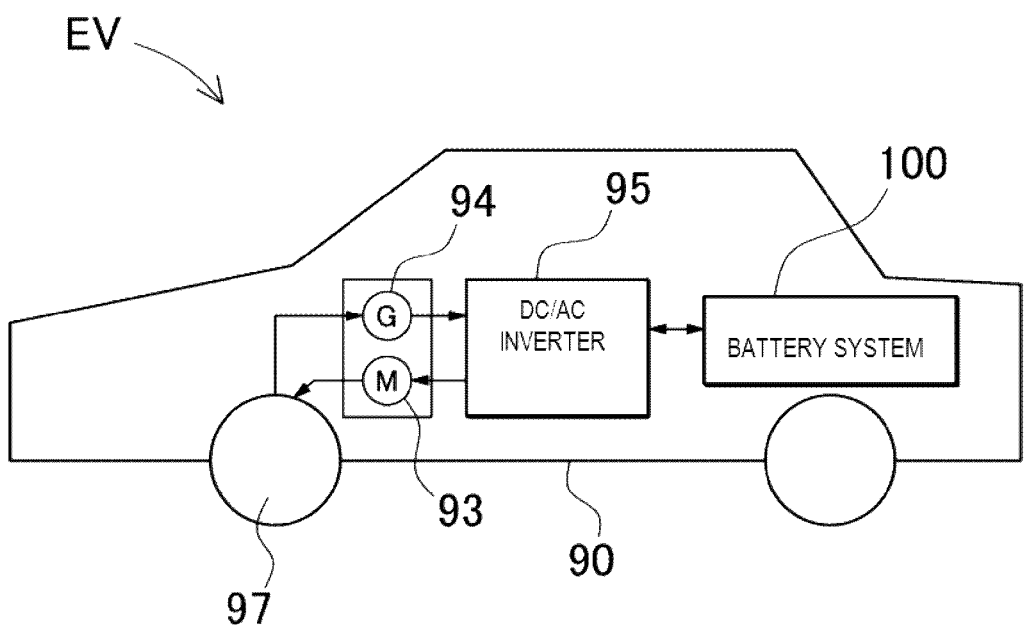
FIG. 9 is a block diagram showing one explanatory embodiment of an electric car driven only by a motor in which the battery system is installed.

FIG. 9 shows an exemplary electric vehicle that is driven only by an electric motor, and includes the battery system. The illustrated vehicle EV with the battery system includes the electric motor 93, which drives the vehicle EV, the battery system 100, which supplies electric power to the electric motor 93, and the electric generator 94, which charges batteries of the battery system 100, a vehicle body 90 that incorporates the motor 93 and the generator 94, and a wheel or wheels 97 that can be driven by the electric motor 93, and drive the vehicle body 90. The electric motor 93 is energized by electric power that is supplied from the battery system 100. The electric generator 94 can be driven by vehicle EV regenerative braking so that the batteries of the battery system 100 are charged.

(Power Storage Type Battery System)

Figure 10:
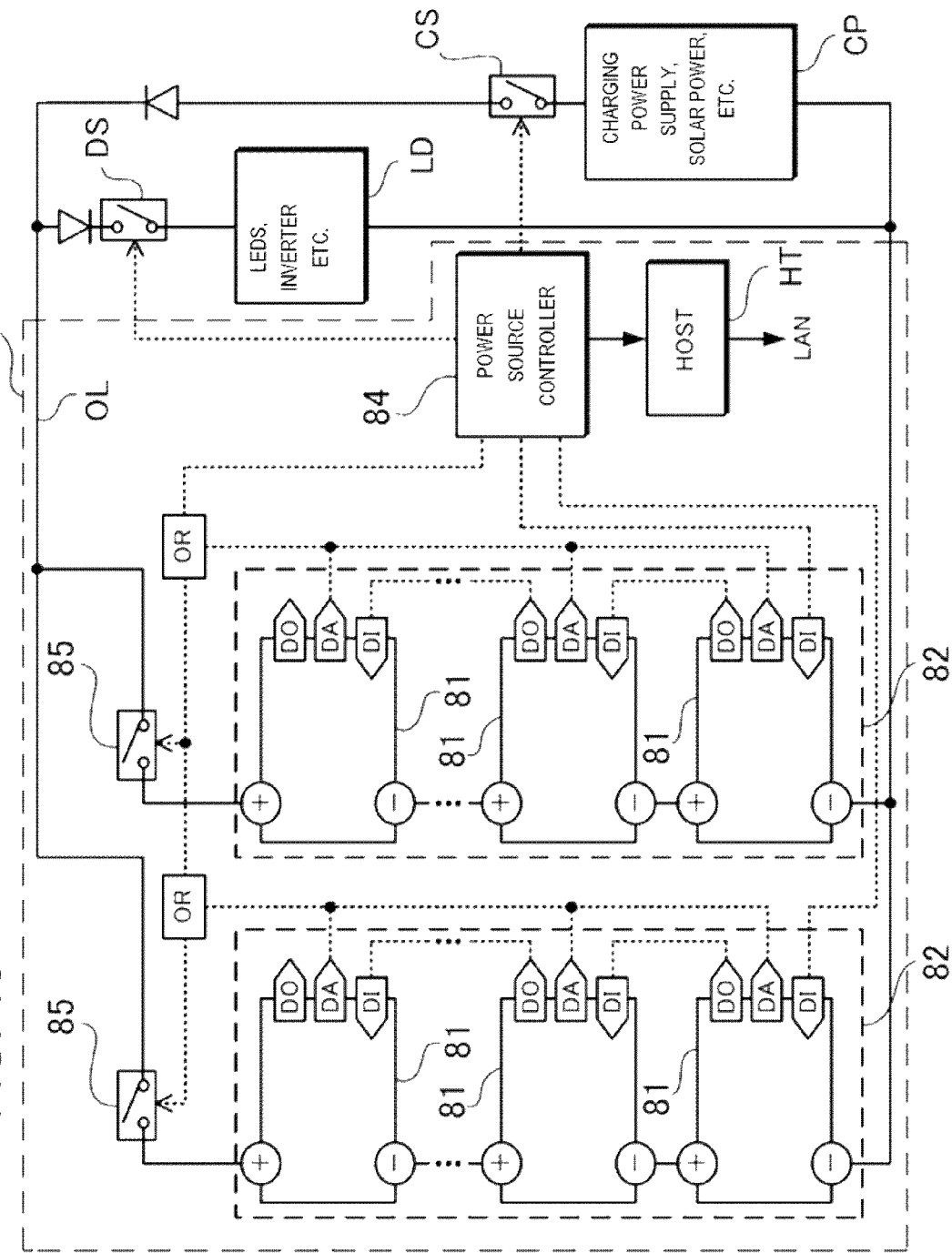
FIG. 10 is a block diagram showing one explanatory embodiment of a storage battery device using the battery system.

The battery system can be used not only as power supply of mobile unit but also as stationary power storage. For example, examples of stationary power storage devices can be provided by an electric power system for home use or plant use that is charged with sunlight or with midnight electric power and is discharged when necessary, a power supply for street lights that is charged with sunlight during the daytime and is discharged during the nighttime, or a backup power supply for signal lights that drives signal lights in the event of a power failure. FIG. 10 shows an exemplary circuit diagram. This illustrated battery system 100 includes battery units 82 each of which includes a plurality of battery packs 81 that are connected to each other. In each of battery packs 81, a plurality of rectangular battery cells 1 are connected to each other in serial and/or in parallel. The battery packs 81 are controlled by a power supply controller 84. In this battery system 100, after the battery units 82 are charged by a charging power supply CP, the battery system 100 drives a load LD. The battery system 100 has a charging mode and a discharging mode. The Load LD and the charging power supply CP are connected to the battery system 100 through a discharging switch DS and a charging switch CS, respectively. The discharging switch DS and the charging operation switch CS are turned ON/OFF by the power supply controller 84 of the battery system 100. In the charging mode, the power supply controller 84 turns the charging operation switch CS ON, and turns the discharging switch DS OFF so that the battery system 100 can be charged by the charging power supply CP. When the charging operation is completed so that the battery units are fully charged or when the battery units are charged to a capacity not lower than a predetermined value, if the load LD requests electric power, the power supply controller 84 turns the charging operation switch CS OFF, and turns the discharging switch DS ON. Thus, operation is switched from the charging mode to the discharging mode so that the battery system 100 can be discharged to supply power to the load LD. In addition, if necessary, the charging operation switch CS may be turned ON, while the discharging switch DS may be turned ON so that the load LD can be supplied with electric power while the battery system 100 can be charged.

The load LD driven by the battery system 100 is connected to the battery system 100 through the discharging switch DS. In the discharging mode of the battery system 100, the power supply controller 84 turns the discharging switch DS ON so that the battery system 100 is connected to the load LO. Thus, the load LD is driven with electric power from the battery system 100. Switching elements such as FET can be used as the discharging switch DS. The discharging switch DS is turned ON/OFF by the power supply controller 84 of the battery system 100. The power supply controller 84 includes a communication interface for communicating with an external device. In the exemplary battery system shown in FIG. 10, the power supply controller is connected to a host device HT based on existing communications protocols such as UART and RS-232C.

Also, the battery system may include a user interface that allows users to operate the electric power system if necessary.

Each of the battery packs 81 includes signal terminals and power supply terminals. The signal terminals include a pack input/output terminal DI, a pack abnormality output terminal DA, and a pack connection terminal DO. The pack input/output terminal DI serves as a terminal for providing/receiving signals to/from other battery packs and the power supply controller 84. The pack connection terminal DO serves as a terminal for providing/receiving signals to/from other battery packs as slave packs. The pack abnormality output terminal DA serves as a terminal for providing an abnormality signal of the battery pack to the outside. Also, the power supply terminal is a terminal for connecting one of the battery packs 81 to another battery pack in series or in parallel. In addition, the battery units 82 are connected to an output line OL through parallel connection switches 85, and are connected in parallel to each other.

INDUSTRIAL APPLICABILITY

A battery system according to the present invention, comprises a battery block having plural stacked battery cells. As the charging and discharging are carried out while detecting the voltage of each of the battery cells, degradation of the battery cells can be prevented. The battery system can be suitably used for a usage requiring a high capacity and a long life, for example, as battery systems of electric power supplies for an electric vehicle, electric power storages for solar cells, wind power generation, midnight electric power, or the like.

The invention claimed is:

1. A battery system comprising:
   plural battery cells;
   a voltage detecting circuit detecting voltage of each of the battery cells; and
   plural voltage detecting lines connecting an electrode terminal of each of the battery cells to input side of the voltage detecting circuit,
   wherein the voltage detecting circuit detects the voltage of each of the battery cells through the voltage detecting lines,
   wherein each of the voltage detecting lines have different lengths,
   wherein the voltage detecting lines include a first voltage detecting line and a second voltage detecting line, and a length of the first voltage detecting line is longer than a length of the second voltage detecting line, and
   wherein at least one of the voltage detecting lines has a resistance adjusting portion which equalizes electrical resistances of the first voltage detecting line and the second voltage detecting line, and through the plural voltage detecting lines of which electrical resistances are equalized by the resistance adjusting portion, the voltage detecting circuit detects the voltage of each of the battery cells.

2. The battery system according to claim 1,
   wherein the plural voltage detecting lines are provided in an electrical printed circuit board,
   wherein the first voltage detecting line has a first resistance adjusting portion and the second voltage detecting line has a second resistance adjusting portion, the first resistance adjusting portion and the second resistance adjusting portion equalizing the electrical resistances of the first voltage detecting line and the second voltage detecting line, and wherein a lateral width (W) of the first resistance adjusting portion of the first voltage detecting line is wider than a lateral width (W) of the second resistance adjusting portion of the second voltage detecting line.

3. The battery system according to claim 2,
wherein a circuit board includes the voltage detecting circuit, and the circuit board has connecting terminals at a predetermined interval connected to the plural voltage detecting lines,
wherein the plural voltage detecting lines are provided in a flexible printed circuit board, and the flexible printed circuit board has connecting portions connected to the connecting terminals of the circuit board,
wherein the resistance adjusting portion of the at least one of the voltage detecting lines is disposed in spaced relationship with the connecting portions, and
wherein the connecting portions have a same lateral width as each other, and are disposed at equal spaces.

4. The battery system according to claim 1,
wherein each of the voltage detecting lines is a lead wire, and the lead wire of the first voltage detecting line is thicker than the lead wire of the short voltage detecting line.

5. The battery system according to claim 1,
wherein the second voltage detecting line is connected to a resistor.

6. The battery system according to claim 1,
wherein an equalizing circuit comprises discharging circuits connected to the battery cells through the voltage detecting lines, and a control circuit which equalizes each of the battery cells by controlling discharge states of the discharging circuits, and
wherein the voltage detecting circuit comprises:
a detecting portion which detects the discharge states of the discharging circuits; and
a compensating portion which by discharge states of the battery cells through detecting the discharge states of the discharging circuits, detects voltage drops of the voltage detecting lines, and compensates the detected voltages of the battery cells by the detected voltage drops.

7. The battery system according to claim 6,
wherein the compensating portion has a memory which stores the voltage drops as compensating voltages in the discharge states of the discharging circuits, and compensates the detected voltages by the compensating voltages stored by the memory.

8. An electric vehicle equipped with the battery system according to claim 1, comprising:
an electric motor being energized by electric power that is supplied from the battery system;
a vehicle body having the battery system and the electric motor; and
a wheel being driven by the electric motor, and driving the vehicle body.

9. A storage battery device equipped with the battery system according to claim 1, comprising:
a power supply controller controlling charging and discharging of the battery system,
wherein the battery system is charged with an external power by the power supply controller, and charging of the battery system is controlled by the power supply controller.

* * * * *